(12) United States Patent
Wang et al.

(10) Patent No.: US 8,648,425 B2
(45) Date of Patent: Feb. 11, 2014

(54) RESISTORS FORMED BASED ON METAL-OXIDE-SEMICONDUCTOR STRUCTURES

(75) Inventors: Wen-Han Wang, Hsin-Chu (TW);
Chen-Chih Wu, Hsin-Chu (TW);
Sheng-Fang Cheng, New Taipei (TW);
Kuo-Ji Chen, Wu-Ku (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/170,751

(22) Filed: Jun. 28, 2011

(65) Prior Publication Data
US 2013/0001704 A1    Jan. 3, 2013

(51) Int. Cl.
*H01L 27/06* (2006.01)
(52) U.S. Cl.
USPC .......... 257/379; 257/382; 257/384; 257/412; 257/413; 257/754
(58) Field of Classification Search
USPC ............... 257/382, 384, 412, 413, 754, 755, 257/E21.35, 358
See application file for complete search history.

(56) References Cited

U.S. PATENT DOCUMENTS

| | | | |
|---|---|---|---|
| 6,541,814 B1 * | 4/2003 | Cao et al. | 257/312 |
| 6,794,707 B1 * | 9/2004 | Cao | 257/312 |
| 7,176,551 B2 * | 2/2007 | Cheng et al. | 257/529 |
| 7,183,612 B2 * | 2/2007 | Okushima | 257/350 |
| 7,939,893 B2 * | 5/2011 | Ema et al. | 257/358 |
| 8,035,191 B2 * | 10/2011 | Lin et al. | 257/529 |
| 8,080,852 B2 * | 12/2011 | Tsutsumi et al. | 257/358 |
| 2002/0033507 A1 * | 3/2002 | Verhaege et al. | 257/360 |
| 2004/0026741 A1 * | 2/2004 | Saito et al. | 257/355 |
| 2005/0133839 A1 * | 6/2005 | Okushima | 257/293 |
| 2008/0211028 A1 * | 9/2008 | Suzuki | 257/360 |
| 2009/0101994 A1 * | 4/2009 | Moon | 257/412 |
| 2011/0073950 A1 * | 3/2011 | Tsutsumi et al. | 257/358 |
| 2011/0156857 A1 * | 6/2011 | Kurz et al. | 337/414 |
| 2011/0241124 A1 * | 10/2011 | Kurz et al. | 257/379 |

* cited by examiner

*Primary Examiner* — Julio J Maldonado
*Assistant Examiner* — Jaehwan Oh
(74) *Attorney, Agent, or Firm* — Slater & Matsil, L.L.P.

(57) ABSTRACT

A device includes a metal-oxide-semiconductor (MOS) device, which includes a gate electrode and a source/drain region adjacent the gate electrode. A first and a second contact plug are formed directly over and electrically connected to two portions of a same MOS component, wherein the same MOS component is one of the gate electrode and the source/drain region. The same MOS component is configured to be used as a resistor that is connected between the first and the second contact plugs.

14 Claims, 5 Drawing Sheets

RESISTORS FORMED BASED ON METAL-OXIDE-SEMICONDUCTOR STRUCTURES

BACKGROUND

For the manufacturing of integrated circuit having small critical dimensions, for example, smaller than about 28 nm, resistors are typically formed using doped OD regions. Due to the low sheet resistance of the doped OD regions, resistors typically occupy large chip areas. In some circuits in which large resistors are needed, the chip areas occupied by the resistors become a significant portion of the overall chip areas. For example, in electro-static discharge (ESD) circuits or resistor-capacitor (RC) timing circuits, the lengths of the resistors may be as great as hundreds of microns. Accordingly, a resistor may include a plurality of doped strips that are separated from each other by isolation regions, such as shallow-trench isolation (STI) regions. The plurality of doped strips is connected in series. These resistors may occupy up to a third of the input/output circuit area. In addition, dummy poly silicon needs to be inserted into the resistor regions for the purpose of process uniformity. This causes the occupied chip area of the resistors to be increased even more.

There are other resistor structures. For example, polysilicon resistors may be formed as a plurality of polysilicon strips connected in series. The polysilicon strips are formed directly over STI regions in order to be electrically insulated from each other. These resistors, however, also occupy large chip areas.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A resistor formed based on a metal-oxide-semiconductor (MOS) structure and the method of forming the same are provided in accordance with an embodiment. The variations of the embodiment are discussed. Throughout the various views and illustrative embodiments, like reference numbers are used to designate like elements.

Figure 1:
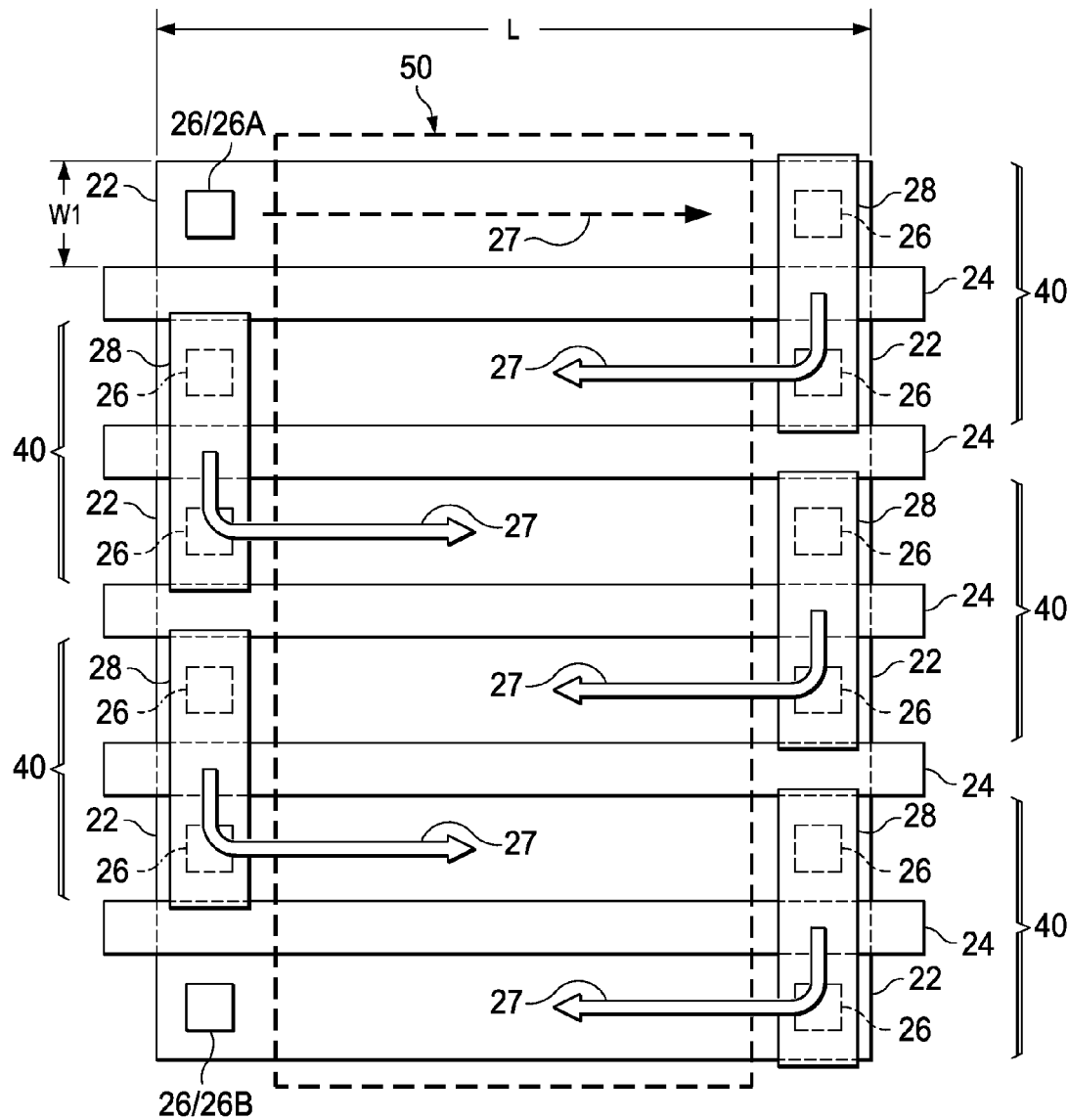
FIG. 1 illustrates a top view of a resistor in accordance with various embodiments, wherein a plurality of source/drain regions of metal-oxide-semiconductor (MOS) devices are connected in series to form a resistor.

FIG. 1 illustrates a top view of resistor 20 in accordance with various embodiments. Resistor 20 includes a plurality of doped regions 22 formed as source regions and drain regions (referred to as source/drain region hereinafter) of a plurality of MOS devices (transistors) 40. Source regions 22 of neighboring MOS devices 40 are merged to form common source regions, and drain regions 22 of neighboring MOS devices 40 are also merged to form common drain regions. A plurality of gate electrodes 24, which may be formed of polysilicon, metals, metal silicides, or other conductive materials, are formed between source/drain regions 22. Gate electrodes 24 and source/drain regions 22 are allocated in an alternating pattern. Each of gate electrodes 24 is between two neighboring sourced/drain regions 22, and forms one of MOS device 40s with the neighboring source/drain regions 22. In the top view as shown in FIG. 1, source/drain regions 22 form long strips. For example, length L and width W1 of source/drain regions 22 may have ratio L/W1 greater than about 10, although greater or smaller ratios may be used. In an embodiment, no isolation regions that are in substrate 30 (not shown in FIG. 1, please refer to FIGS. 2A and 2B) are formed to separate source/drain regions 22 from neighboring gate electrodes 24.

Each of source/drain regions 22 may be connected to two contact plugs 26, which are formed at locations close to opposite ends of the respective source/drain region 22. Therefore, each of source/drain regions 22 forms a resistor that is connected between the contact plugs 26. The two contact plugs 26 that are connected to the same source/drain region 22 are not connected by a metal line that is in an overlying metal layer. Otherwise, the resistor is shorted. Accordingly, two contact plugs 26 may be at different voltage levels when a current flows through the resistor formed of source/drain region 22. Metal lines 28, which may be part of the metal layer of the respective chip, may be used to serially connect the plurality of resistors formed of the plurality of source/drain regions 22 as one resistor. For example, as shown in FIG. 1, the resistors formed of source/drain regions 22 are connected as resistor 20, which is between contact plugs 26A and 26B. Currents 27 in the resistors are configured to flow in the direction parallel to the gate width direction of MOS devices 40, and parallel to the lengthwise directions of gate electrodes 24.

Figure 2A:
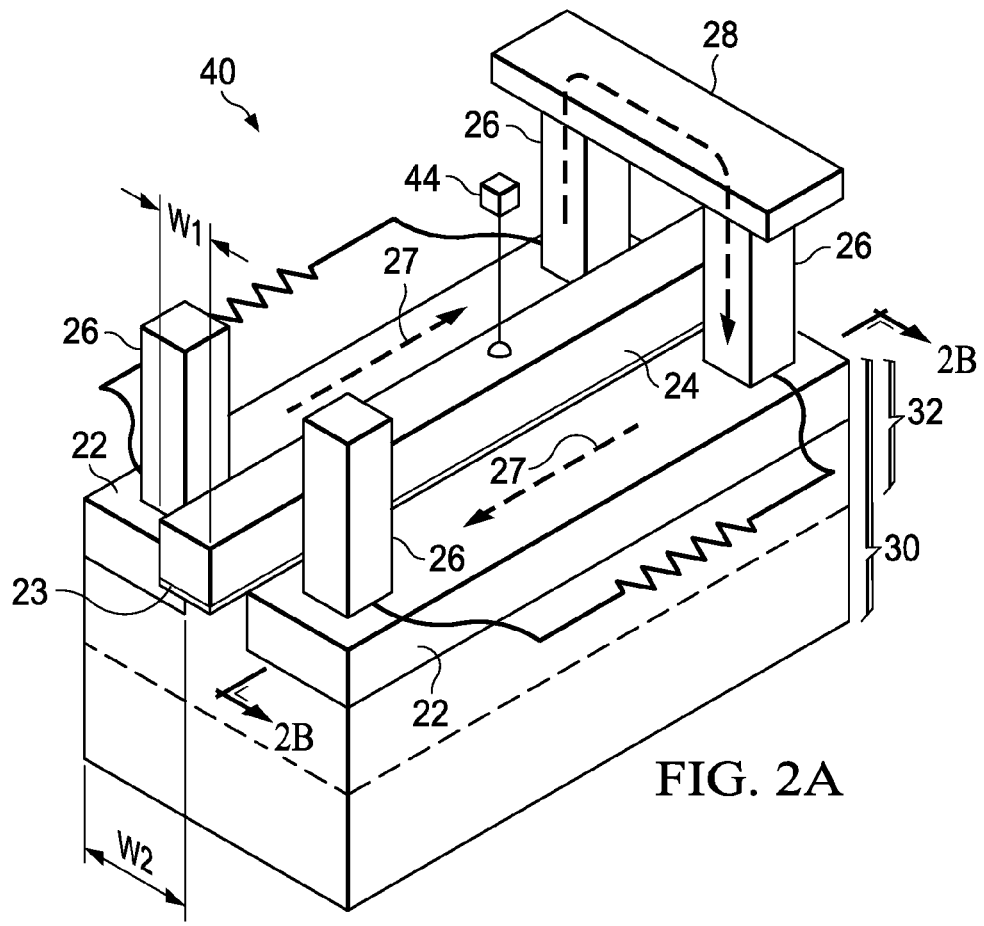
FIG. 2A illustrates a perspective view of a portion of the resistor shown in FIG. 1.

FIG. 2A illustrates a perspective view of a portion of resistor 20 as shown in FIG. 1, wherein one MOS device 40 formed of one of gate electrodes 24 and two of source/drain regions 22 are illustrated. In an embodiment, MOS device 40 is formed at the surface of substrate 30, which may be a semiconductor substrate such as a silicon substrate, although other commonly used semiconductor materials may also be used. Substrate 30 may be of p-type, although it can also be of n-type. Gate dielectric 23 is under gate electrode 24, and isolates gate electrode 24 from the underlying well region 32, if any, or from substrate 30 if no well region 32 is formed.

In an embodiment, no isolation region such as an STI region is formed directly under gate electrode 24. Accordingly, there is a channel that is configured to conduct a current between neighboring source and drain regions that belong to the same MOS device 40. Furthermore, no isolation regions such as STI regions are formed to separate neighboring MOS devices 40. Gate dielectric 23 is formed under gate electrode 24, and is directly over the channel region. In an embodiment, width W1 of gate electrodes 24 may be smaller than about 0.4 μm, and width W2 of source/drain regions may be smaller than about 0.4 μm. Widths W1 and W2 may also be the minimum dimensions allowed by the forming technology of MOS device 40.

Optionally, well region 32 is formed in substrate 30, and has an impurity concentration higher than the impurity concentration of substrate 30. In an embodiment, MOS device 40 is a p-type MOS (PMOS) device, and source/drain regions 22 are of p-type, and well region 32 is of n-type. In alternative embodiments, MOS device 40 is an n-type MOS (NMOS) device, and source/drain regions 22 are of n-type, and well region 32 is of p-type. Source/drain regions 22 are heavily doped, for example, with a p-type or n-type impurity concentration between about $10^{19}/cm^3$ and about $10^{21}/cm^3$, although a higher or a lower impurity concentration may also be used.

Figure 2B:
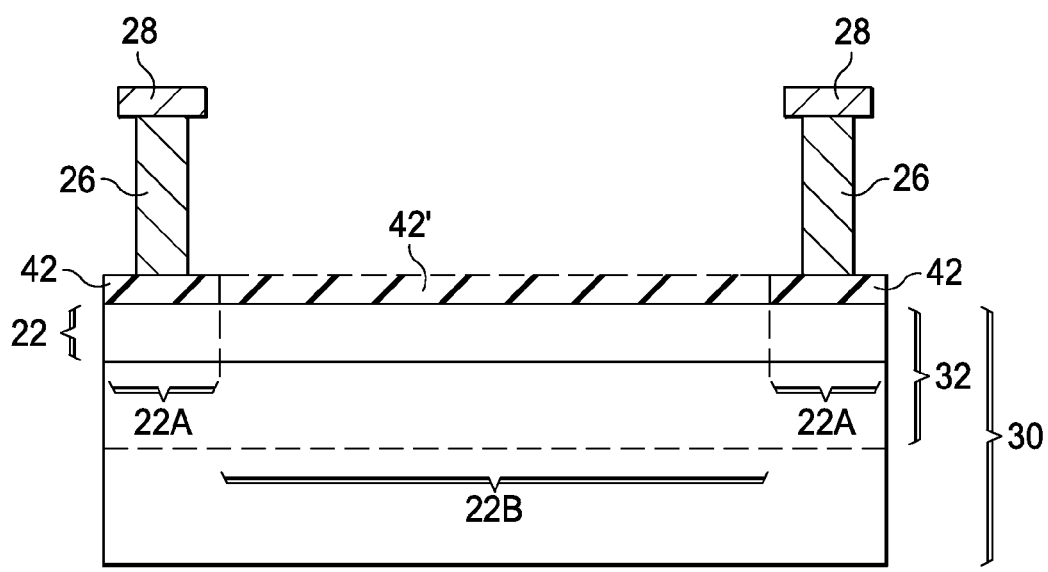
FIG. 2B illustrates a cross-sectional view of the resistor shown in FIG. 2A, wherein silicide regions are formed directly over end portions of a source/drain region, and non silicide region is formed directly over a middle portion of the source/drain region as covered by layer 50 in FIG. 1.

FIG. 2B illustrates a cross-sectional view of the structure shown in FIG. 2A, wherein the cross-sectional view is obtained from the vertical plane crossing line 2B-2B in FIG. 2A. In an embodiment, silicide regions 42 (including the portions shown using dashed lines 42') are formed over and contacting entireties of source/drain regions 22, wherein silicide regions 42 connect source/drain regions 22 to contact plugs 26. In alternative embodiments, silicide regions 42 are formed directly over portions 22A of source/drain regions 22, wherein portions 22A are close to the opposite ends of sourced/drain regions 22. Non silicide regions are formed directly in the middle portions 22B of source/drain regions 22. Accordingly, due to the lack of silicide, the resistor has a higher sheet resistance than if silicide regions 42' are formed.

In an embodiment, MOS device 40 is a PMOS device. During the operation, gate electrode 24 is connected to a positive voltage, for example, a VDD voltage (or any voltage that is high enough to turn off MOS device 40), so that the channel that is directly under gate electrode 24 and gate dielectric 23 is turned off. The VDD voltage is the positive power supply voltage. In alternative embodiments, MOS device 40 is an NMOS device. During the operation, gate electrode 24 is connected to a low voltage, for example, a VSS voltage (or any other voltage that is low enough to turn off MOS device 40), so that the channel that is directly under gate electrode 24 and gate dielectric 23 is turned off. The VSS voltage is also a power supply voltage, and may be the electrical ground voltage. A voltage source 44 may thus be used to generate the voltage that is applied on gate electrode 24 to turn off MOS device 40.

Figure 3:
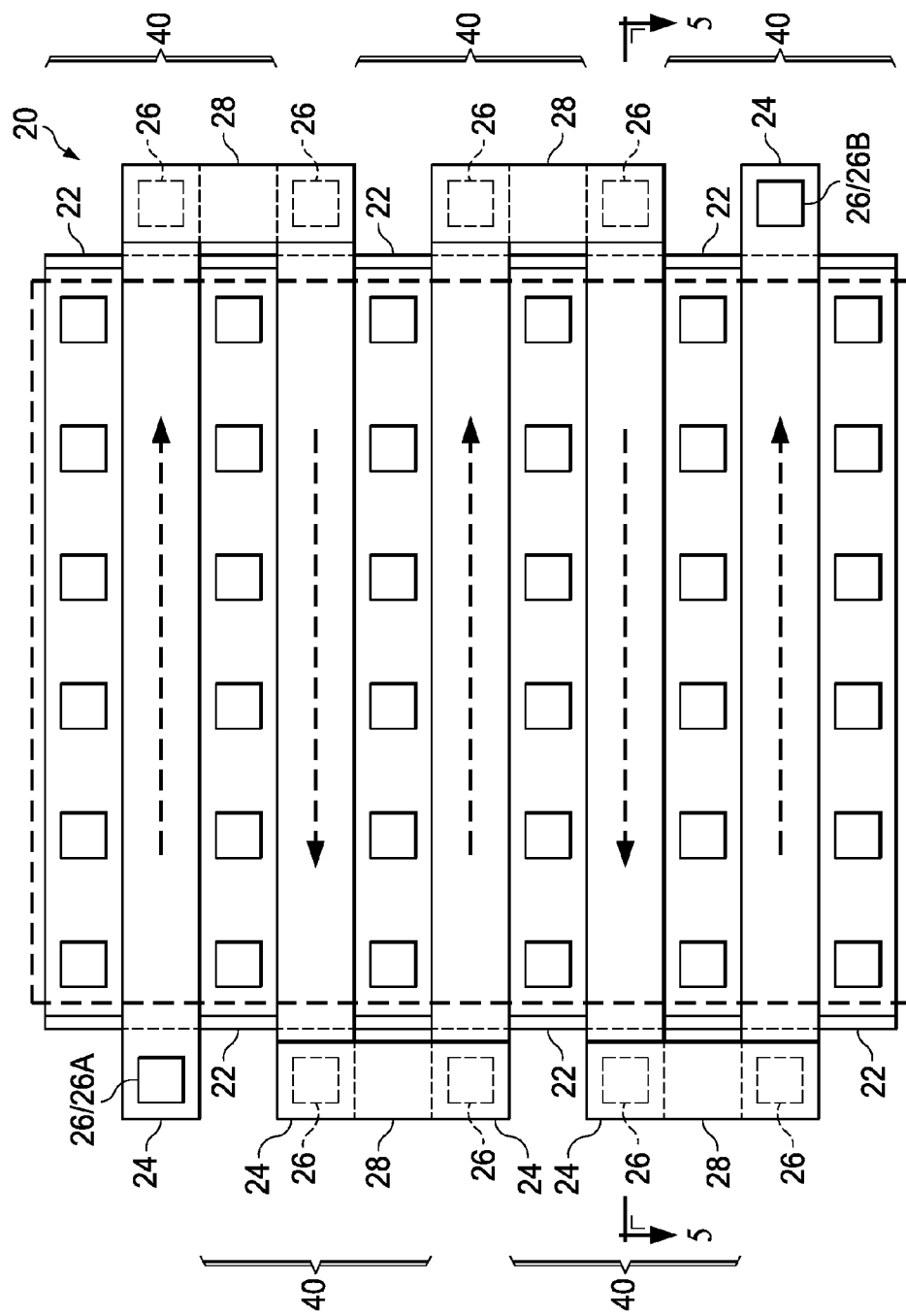
FIG. 3 illustrates a top view of a resistor in accordance with embodiments, wherein a plurality of gate electrodes of MOS devices are connected in series to form a resistor.
Figure 4:
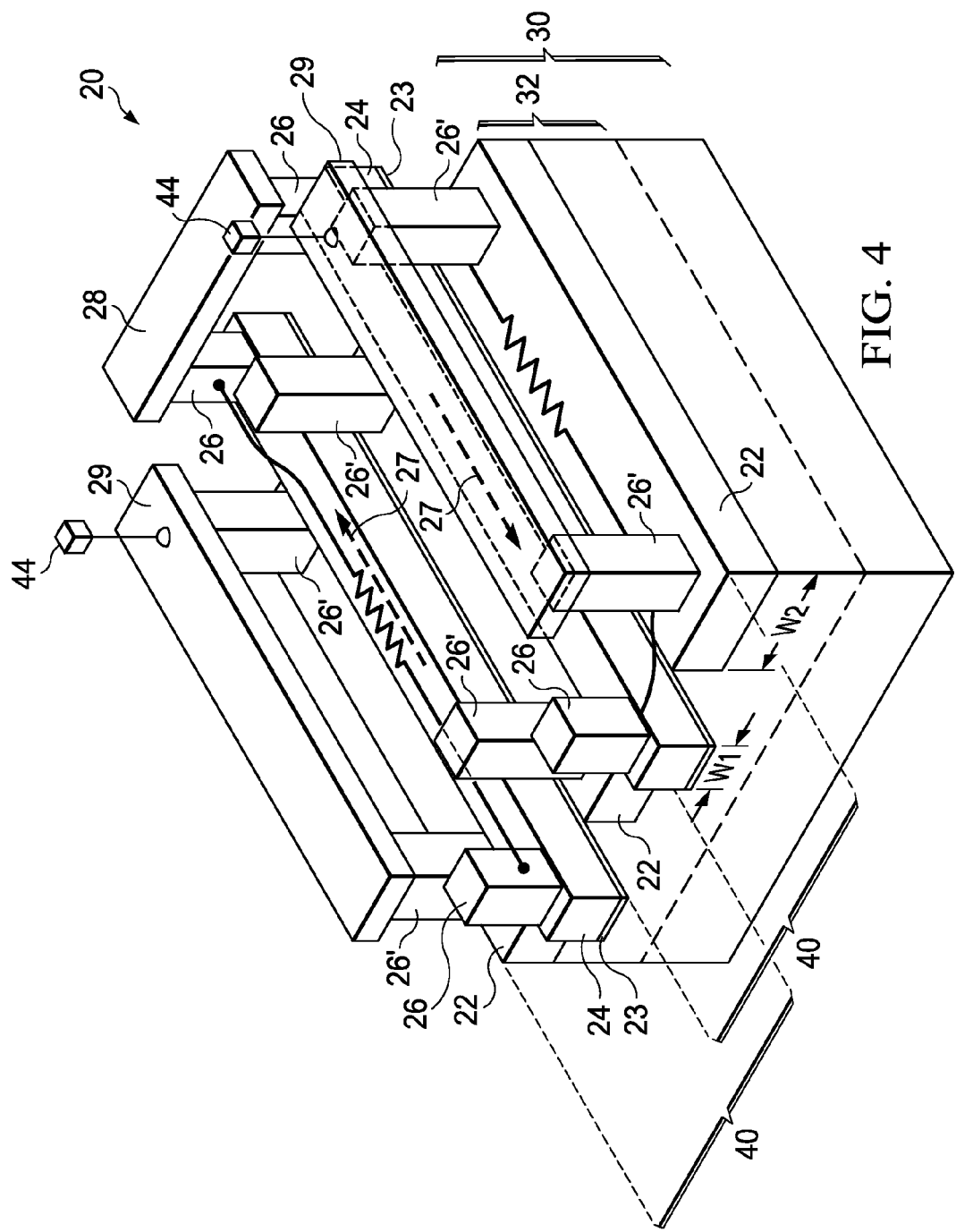
FIG. 4 illustrates a perspective view of a portion of the resistor shown in FIG. 3.

FIGS. 3 and 4 illustrate a top view and a perspective view, respectively, of resistor 20 in accordance with alternative embodiments. These embodiments are similar to the embodiments illustrated in FIGS. 1 and 2, except gate electrodes 24, instead of source/drain regions 22, are used to form resistor 20. Unless specified otherwise, the reference numerals in these embodiments represent like elements in the embodiments illustrated in FIGS. 1 through 2B. Referring to FIG. 3, source/drain regions 22 and gate electrodes 24 may be essentially the same as shown in FIG. 1. Contacts plugs 26 are formed directly over, and electrically connected to, gate electrodes 24. Each of gate electrodes 24 may be connected to two contact plugs 26 that are formed close to opposite ends of the respective gate electrode 24. Therefore, each of gate electrodes 24 forms a resistor. The two contact plugs 26 that are connected to the same gate electrode 24 are not connected to a same metal line. Otherwise, the resistor is shorted. Accordingly, two contact plugs 26 may be at different voltage levels when a current flows the resistor formed of gate electrode 24. Metal lines 28, which may be formed in the bottom metal layer, may be used to serially connect the plurality of resistors that are formed of the plurality of gate electrodes 24 as one resistor. For example, as shown in FIG. 3, a resistor that includes the multiple serially connected resistors is formed between contact plugs 26A and 26B. In an embodiment, no isolation region such as STI region is formed directly under gate electrodes 24. Accordingly, there is a channel that can be configured to conduct a current between neighboring source and drain regions that belong to the same MOS device 40. Furthermore, no isolation regions such as STI regions are formed to separate neighboring MOS devices 40.

FIG. 4 illustrates a perspective view of a portion of resistor 20 as shown in FIG. 3. In an embodiment, MOS device 40 is a PMOS device. To avoid channel conduction, during the operation, source/drain regions 22 are connected to the same voltage level (which may be a positive voltage level), for example, the VDD voltage, which may be provided by voltage source 44. The connection between voltage source 44 and source/drain regions 22 may be made through contact plugs 26' and metal lines 29. In alternative embodiments, MOS device 40 is an NMOS device. During the operation, source/drain regions 22 are connected to a same voltage level, for example, VSS, to avoid channel conduction.

Figure 5:
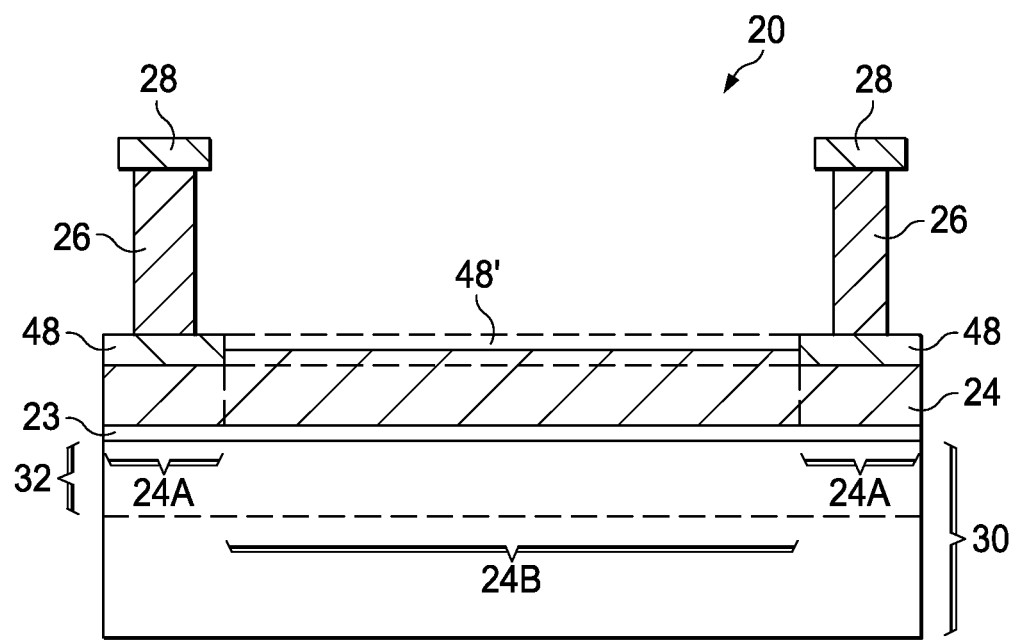
FIG. 5 illustrates a cross-sectional view of the resistor shown in FIG. 4, wherein silicide is formed directly over end portions of a gate electrode, and is not formed directly over a middle portion of the gate electrode.

FIG. 5 illustrates a cross-sectional view of the structure shown in FIG. 3, wherein the cross-sectional view is obtained from the vertical plane crossing line 5-5 in FIG. 3. In an embodiment, gate silicide region(s) 48 (including dashed portions 48') are formed over an entirety of gate electrode 24, wherein silicide regions 48 connect gate electrodes 24 to contact plugs 26. In alternative embodiments, silicide regions 48 are formed directly over portion 24A of gate electrodes 24, wherein portions 24A are opposite end portions of gate electrodes 24. Non silicide regions are formed directly in the middle portions 24B of gate electrodes 24. Accordingly, due to the lack of silicide, the portions 24B of resistor 20 have higher sheet resistances than if silicide regions 48' are formed. The partial formation of gate silicides 48 (and also source/drain silicide 42 in FIG. 2B) may be achieved by forming a resist protection oxide 50 (not shown in FIG. 5, please refer to FIGS. 1 and 3) to cover middle portion 22B of source/drain regions 22 in FIG. 2B, or cover middle portion 24B of gate electrodes 24 in FIG. 5, and forming the silicide.

In the embodiments, due to the use of MOS structures to form resistors, the widths W1 (FIGS. 2A and 4) of gate electrodes 24 and W2 of source/drain regions 22, respectively, may be reduced significantly compared to conventional resistors that are formed directly over or between isolation regions (such as STI regions). Since widths W1 and W2 are reduced, the resistance value of same length is increased, hence the total required lengths of a specific resistance value are reduced in addition to the reduction in the widths. About 50 percent area reduction may be achieved by using the embodiments compared to convention resistors. In addition, by using the MOS structures, there is no need to insert additional dummy poly into convention resistor regions.

In accordance with embodiments, a device includes a metal-oxide-semiconductor (MOS) device, which includes a gate electrode and a source/drain region adjacent the gate electrode. A first and a second contact plug are formed directly over and electrically connected to two portions of a same MOS component, wherein the same MOS component is one of the gate electrode and the source/drain region. The same MOS component is configured to be used as a resistor that is formed between the first and the second contact plugs.

In accordance with other embodiments, a device includes a semiconductor substrate, a plurality of gate electrodes parallel to each other, and a plurality of gate dielectrics. Each of the plurality of gate dielectrics is directly under one of the plurality of gate electrodes and over the semiconductor substrate. A plurality of doped regions is formed in the semiconductor substrate. The plurality of gate electrodes and the plurality of doped regions are allocated in an alternating pattern to form a plurality of MOS devices. The doped regions form resistors configured to conduct currents in directions parallel to lengthwise directions of the plurality of gate electrodes. A plurality of electrical connections is formed to connect the resistors in series.

In accordance with yet other embodiments, a device includes a plurality of gate electrodes parallel to each other, and a plurality of gate dielectrics, wherein each of the plurality of gate dielectrics is directly under one of the plurality of gate electrodes and over a semiconductor substrate. A plurality of doped regions is formed in the semiconductor substrate. The plurality of gate electrodes and the plurality of doped regions are allocated in an alternating pattern. The plurality of gate electrodes and the plurality of doped regions form MOS devices. The plurality of gate electrodes form resistors that are configured to conduct currents in a direction parallel to lengthwise directions of the plurality of gate electrodes. A plurality of electrical connections is formed to connect the resistors in series.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a metal-oxide-semiconductor (MOS) device comprising:
      a gate electrode; and
      a first source/drain region adjacent the gate electrode; and
   a first and a second contact plug directly over and electrically connected to two portions of a same MOS component, wherein the same MOS component is the first source/drain region, wherein the same MOS component is configured to be used as a resistor that is formed between the first and the second contact plugs, and wherein the first and the second contact plugs are configured to be at different voltage levels;
   a second source/drain region adjacent the gate electrode, wherein the first and the second source/drain regions are on opposite sides of the gate electrode; and
   a third and a fourth contact plug directly over and electrically connected to opposite ends of the second source/drain region, wherein the second and the third contact plugs are interconnected through a metal line, and wherein the first and the second source/drain regions form two serially connected resistors that are connected between the first and the fourth contact plugs.

2. The device of claim 1, wherein the MOS device is a p-type MOS (PMOS) device, and wherein the gate electrode is configured to receive a voltage for turning off the PMOS device.

3. The device of claim 2, wherein the voltage is a VDD voltage.

4. The device of claim 1, wherein the MOS device is an n-type MOS (NMOS) device, and wherein the voltage is a VSS voltage.

5. A device comprising:
   a semiconductor substrate;
   a plurality of gate electrodes parallel to each other;
   a plurality of gate dielectrics, wherein each of the plurality of gate dielectrics is directly under one of the plurality of gate electrodes and over the semiconductor substrate;
   a plurality of doped regions in the semiconductor substrate, wherein the plurality of gate electrodes and the plurality of doped regions are allocated in an alternating pattern to form a plurality of metal-oxide-semiconductor (MOS) devices, and wherein the doped regions form resistors configured to conduct currents in directions parallel to lengthwise directions of the plurality of gate electrodes; and
   a plurality of electrical connections connecting the resistors in series.

6. The device of claim 5, wherein the MOS devices are p-type MOS devices, and wherein the plurality of gate electrodes is electrically connected to a positive voltage that is configured to turn off the MOS devices.

7. The device of claim 6, wherein the plurality of gate electrodes is electrically connected to VDD.

8. The device of claim 5, wherein the MOS devices are n-type MOS devices, and wherein the plurality of gate electrodes is electrically connected to a low voltage that is configured to turn off the MOS devices.

9. The device of claim 8, wherein the plurality of gate electrodes is electrically connected to VSS.

10. The device of claim 5, wherein no isolation regions are formed directly under the gate dielectrics.

11. A device comprising:
    a metal-oxide-semiconductor (MOS) device comprising:
       a gate electrode; and
       a first source/drain region substantially aligned with a first sidewall of the gate electrode; and
    a first and a second contact plug directly over and electrically connected to two portions of a same MOS component, wherein the same MOS component is the first source/drain region, wherein the same MOS component is configured to be used as a resistor that is formed between the first and the second contact plugs, and wherein the first and the second contact plugs are configured to be at different voltage levels;
    a second source/drain region substantially aligned with a second sidewall of the gate electrode, wherein the first and the second sidewalls are on opposite sides of the gate electrode; and
    a third and a fourth contact plug directly over and electrically connected to opposite ends of the second source/drain region, wherein the second and the third contact plugs are interconnected through a metal line, and wherein the first and the second source/drain regions form two serially connected resistors that are connected between the first and the fourth contact plugs.

12. The device of claim 11, wherein the MOS device is a p-type MOS (PMOS) device, and wherein the gate electrode is configured to receive a voltage for turning off the PMOS device.

13. The device of claim 12, wherein the voltage is a VDD voltage.

14. The device of claim 11, wherein the MOS device is an n-type MOS (NMOS) device, and wherein the voltage is a VSS voltage.

* * * * *